United States Patent [19]
Fujinami et al.

[11] Patent Number: 5,371,327
[45] Date of Patent: Dec. 6, 1994

[54] HEAT-SEALABLE CONNECTOR SHEET

[75] Inventors: Naoki Fujinami; Kazuyoshi Yoshida; Satoshi Odashima, all of Saitama, Japan

[73] Assignee: Shin-Etsu Polymer Co., Ltd., Tokyo, Japan

[21] Appl. No.: 17,638

[22] Filed: Feb. 12, 1993

[30] Foreign Application Priority Data

| Feb. 19, 1992 | [JP] | Japan | 4-069668 |
| Aug. 31, 1992 | [JP] | Japan | 4-255801 |
| Sep. 28, 1992 | [JP] | Japan | 4-282437 |

[51] Int. Cl.$^5$ .................................. H05K 1/09
[52] U.S. Cl. ...................... 174/257; 174/254; 361/751; 361/749; 439/77
[58] Field of Search ............ 174/254, 257, 259; 361/749, 751; 439/77

[56] References Cited

U.S. PATENT DOCUMENTS

| 4,569,877 | 2/1986 | Tollefson et al. | 428/141 |
| 4,680,226 | 7/1987 | Takeda | 428/327 |
| 4,960,490 | 10/1990 | Berg et al. | 156/656 |
| 5,001,302 | 3/1991 | Atsumi | 174/94 R |
| 5,155,301 | 10/1992 | Mase | 174/88 R |
| 5,225,966 | 7/1993 | Basavanhally et al. | 361/406 |
| 5,260,519 | 11/1993 | Knickerbocker et al. | 174/262 |

Primary Examiner—Leo P. Picard
Assistant Examiner—L. Thomas
Attorney, Agent, or Firm—McAulay Fisher Nissen Goldberg & Kiel

[57] ABSTRACT

Proposed is a novel heat-sealable connector sheet, by which very reliable electric connection can be obtained with electrode terminals on an electronic device or a circuit board, consisting of a flexible insulating plastic substrate sheet and a patterned electroconductive layer formed thereon from an electroconductive paste with an overcoating layer of an insulating melt-flowable adhesive. Different from the electroconductive pastes used in conventional connector sheets, the electroconductive paste used here is compounded with an appropriate amount of relatively coarse particles of an insulating material having elasticity, e.g., plastic resins. The patterned electroconductive layer is formed from such a composite conductive paste in such a fashion that the insulating particles are fully embedded in the conductive paste but forming protrusions on the surface of the patterned electroconductive layer which accordingly exhibits a rugged appearance.

14 Claims, 1 Drawing Sheet

HEAT-SEALABLE CONNECTOR SHEET

BACKGROUND OF THE INVENTION

The present invention relates to a heat-sealable connector sheet or, more particularly, to a connector sheet for making electrical connection between the electrode terminals on an electronic device, such as liquid crystal display units, electroluminescence display units, light-emitting diodes, electrochromic display units, plasma display units and the like, and the electrode terminals of the driving circuit therefor formed on a circuit board or between two sets of electrode terminals on different electric circuit boards.

It is well established that electrical connection between two sets of electrode terminals as mentioned above can be achieved by using a heat-sealable connector sheet consisting of an electrically insulating substrate sheet having flexibility and a patterned layer formed by printing thereon with an electroconductive paste which is a composite of an insulating adhesive resin blended with fine particles having electric conductivity in such an amount that the electroconductive layer formed therefrom has anisotropic electroconductivity only in the direction perpendicular to the plane of the layer (see, for example, Japanese Patent Publications 55-38073 and 58-56996).

The heat-sealable connector sheets of this type, however, cannot fully comply with the demand in the modern electronic technology which is constantly under a trend toward more and more compact design of the electronic instruments in which the pitch of the linewise patterned electrode terminals in an array is decreasing to 0.3 mm, to 0.2 mm or even finer. When electrical connection is made between such finely patterned electrode terminals by using a heat-sealable connector sheet of the above described type, namely, short-circuiting is sometimes unavoidable between adjacent two terminals as a consequence of displacement of the electroconductive particles out of the proper position. This problem has been at least partly solved by the teaching in Japanese Patent Kohyo 62-500828 and Japanese Patent Kokai 62-154746 according to which an overcoating layer is provided over the whole surface of the connector sheet with a melt-flowable insulating adhesive. When electrode terminals are connected by using such a connector sheet under heating and pressure, melt of the melt-flowable adhesive is driven off from the surface of the conductive line patterns to form a pool of the melt between the conductive lines to ensure good insulation between the conductive lines.

The above proposed improvement in a conventional heat-sealable connector sheet, however, is far from a complete solution of the problems. To explain it, the electroconductive particles dispersed in the insulating adhesive matrix to form a conductive paste are usually formed from a metal or a carbonaceous material having high rigidity so that the particles cannot comply with the deformation or displacement of the insulating flexible substrate, electroconductive layer and the insulating overcoating adhesive layer in conducting heat-sealing with heating under pressure. The particles also may be subject to a microscopic displacement due to the residual stress in the layers after heat sealing. Therefore, troubles are sometimes caused in the assembly of electrode terminals constructed by using such a heat-sealable connector sheet such as failure of electrical connection, increase in the electric resistance between the thus connected terminals and the like during use resulting in a loss of reliability of the electric connection.

The above described problem could of course be solved by replacing the electroconductive particles of high rigidity with particles of a polymeric material having flexibility. Indeed, a proposal is made for the use of particles of an elastic polymeric material having a plating layer of a noble metal on the surface thereof to impart electroconductivity. These noble metal-plated elastomer particles, however, have another problem that microscopic cracks are sometimes formed in the plating layer as a consequence of the difference in the hardness and other physical properties between the core particles and the surface-plating layer so that a trouble of electric corrosion may take place due to a trace amount of residual electrolyte on the thus exposed surface of the core particles remaining after the plating treatment of the particles with the noble metal. Needless to say, the expensiveness of such noble metal-plated particles is another disadvantage to prohibit industrialization of this technology.

SUMMARY OF THE INVENTION

The present invention accordingly has an object to provide a novel heat-sealable connector sheet which is free from the above described problems and disadvantages in the conventional heat-sealable connector sheets in which the electrically conducting patterned layer is formed from an electroconductive paste compounded with conductive fine particles and is capable of making electrical connection between electrode terminals with very high reliability even under adverse ambient conditions after heat-sealing.

Thus, the heat-sealable connector sheet of the invention comprises:

(a) a substrate sheet made from an electrically insulating material having flexibility;
(b) a patterned electroconductive layer formed on one surface of the substrate sheet from an electroconductive paste compounded with electrically insulating particles, preferably, having elasticity in such a fashion that the electrically insulating particles are fully embedded in the electroconductive paste to form protrusions on the surface of the layer covered by the electroconductive paste; and
(c) an overcoating layer of a melt-flowable adhesive on the surface of the patterned electroconductive layer, optionally, extending to the surface of the substrate sheet not covered by the patterned electroconductive layer.

In a preferable embodiment of the above defined heat-sealable connector sheet, the electrically insulating particles dispersed and embedded in the electroconductive paste have a porous structure. In another preferable embodiment, an additional electroconductive layer of an electroconductive paste is interposed between the patterned electroconductive layer containing the electrically insulating particles and the substrate sheet so that the patterned electroconductive layer has a double-layered structure consisting of an underlying layer of an electroconductive paste containing no insulating particles and a surface layer of an electroconductive paste compounded with insulating particles.

DETAILED DESCRIPTION OF THE PREFERRED EMBODIMENTS

Figure 1:
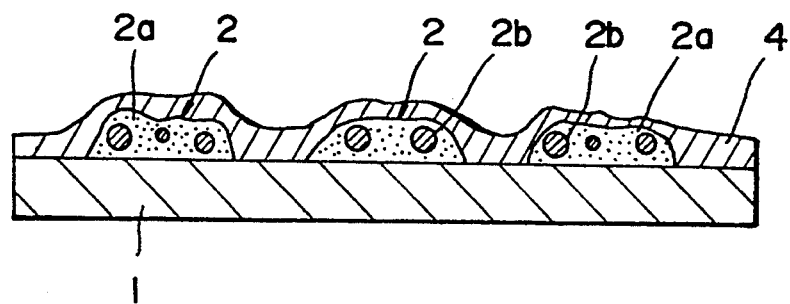
FIG. 1 is a cross sectional view of an embodiment of the inventive heat-sealable connector sheet as cut perpendicularly to the plane of the sheet.

As is described above, the most characteristic feature of the inventive heat-sealable connector sheet consists in the unique composite structure of the patterned electroconductive layer containing the insulating particles dispersed and embedded in the electroconductive paste to form the layer in a specified fashion. As a consequence of the unique structure of the electroconductive patterned layer, greatly improved reliability can be obtained by the use of the inventive connector sheet in the electrical connection between electrode terminals.

The electrically insulating substrate, on which the patterned electroconductive layer is formed in such a pattern to match the arrangement of the electrode terminals to be connected therewith, preferably has flexibility so that the material thereof is selected usually from various kinds of polymeric materials in the form of a film or sheet having a thickness of 10 to 50 $\mu$m though not particularly limitative depending on the intended application of the inventive connector sheet. Examples of the polymeric materials or plastic resins suitable for the substrate include polyimide resins, poly(ethylene terephthalate) resins, poly(ethylene naphthalate) resins, poly(butylene terephthalate) resins, polycarbonate resins, poly(phenylene sulfide) resins, poly(1,4-cyclohexane dimethylene terephthalate) resins, polyallylate resins, liquid-crystalline polymers and the like.

The electroconductive paste, in which the insulating particles are dispersed, is in itself a composite material consisting of an organic insulating binder resin as the matrix and fine particles having electric conductivity by forming a dispersed phase in the matrix of the insulating binder. The type of the binder resin as the matrix phase of the electroconductive paste is not particularly limitative including thermoplastic and thermosetting resins, of which thermosetting ones are preferred in respect of the good heat resistance and mechanical stability after curing to withstand the compressive force encountered in the connecting work of electrode terminals by using the inventive connector sheet as compared with thermoplastic ones. It is optional according to need to admix the matrix resin with various kinds of known additives such as curing accelerators, levelling agents, dispersion stabilizers, antifoam agents, thixotropy-imparting agents and the like.

The above described binder resin to form the matrix of the paste is compounded with electroconductive particles in order that the paste is imparted with electroconductivity. The material of the particles is usually selected from metals, e.g., silver, copper, gold, nickel, palladium and the like as well as alloys of these metals. Silver- or gold-plated particles of copper or other base metals as well as plastic resins are also suitable. The average particle diameter of the conductive particles should preferably be in the range from 0.1 to 10 $\mu$m. The particle configuration of the conductive particles is not particularly limitative including irregularly granular, spherical, flaky, platelet-like, dendritic, cubic and the like. The amount of the conductive particles dispersed in the matrix of the binder resin is usually in the range from 10 to 950% by weight based on the binder resin in order to impart the paste with a sufficiently high electric conductivity.

An electroconductive paste can be prepared by uniformly blending, in a specified proportion, the above described insulating binder resin and the electroconductive fine particles, if necessary, with dilution by the addition of an organic solvent. In the preparation of the inventive heat-sealable connector sheet, the electroconductive paste must be further blended with electrically insulating particles of either an inorganic or organic material, of which polymeric materials more or less having elasticity are preferred such as poly(methyl methacrylate) resins, polyamide resins, polystyrenes, benzoguanamine resins, phenolic resins, epoxy resins, aramid resins, acrylonitrile-butadiene copolymeric rubbers, polychloroprene rubbers, silicone rubbers and the like. Polyamide and related resins such as nylons, aramid resins and polyimide resins are particularly preferable in respect of the good balance relative to the solvent resistance, elastic modulus, shapability into particles, oil-absorptivity, adhesion behavior and the like. It is also important that the polymeric material forming the insulating particles has a melting point of 80° C. or higher or, preferably, 120° C. or higher in order that the particles retain their particulate configuration even in the heat sealing works usually conducted under pressure at a temperature of 80° C. or higher. When particles made from a rigid inorganic material are used as the insulating particles in the inventive connector sheet, troubles may be caused in the connecting work of electrode terminals with the connector sheet due to eventual fracture of the insulating particles by the compressive force applied to the connector sheet at an elevated temperature, especially, when the material of the particles is relatively brittle. Even if no fracture of the insulating particles take place, another possible problem is that the layer of the electroconductive paste covering the protruded point of the particle is eventually pierced through by the sharp point of the particles to expose the insulating particles as uncovered with the electroconductive paste greatly decreasing the reliability in the electric connection with the connector sheet. The particle configuration of the insulating particles is also not particularly limitative including irregularly granular, spherical, flaky, platelet-like, dendritic cubic ones. It is sometimes preferable that at least the surface layer of the insulating particle has a porous structure with a porosity in the range, for example, from 5 to 80%.

Further, it is preferable that the material, assuming that it is a polymeric material, forming the insulating particles or at least the surface layer thereof has a value of solubility parameter not greater or not smaller by 2 or more or, more preferably, by 1 or more than the value of the binder resin forming the matrix phase of the electroconductive paste in order to ensure good compatibility between the matrix phase and the insulating particles dispersed therein. This condition is also favorable to prevent piercing of the electroconductive patterned layer by the points of the insulating particles by virtue of the good adhesion between the phases.

The particle diameter d which the insulating particles should have depends on the thickness t of the electroconductive patterned layer, which is usually in the range from 5 to 30 μm, formed from the electroconductive paste. Preferably, the particle diameter d of the insulating particles should be at least one third or, more preferably, at least equal to t which is the thickness of the patterned layer formed from the electroconductive paste as measured at the point having no insulating particles therein. When the particle diameter d of the insulating particles is too small, protrusions can hardly be formed by the insulating particles with a covering layer of the electroconductive paste because the particles are fully embedded in the conductive layer forming a flat and smooth surface without protrusions. The particle diameter d of the insulating particles should not exceed five times or, preferably, twice of the thickness of the layer t. In addition, the width w of the patterned line-wise electroconductive layer should also be taken into consideration in the selection of the particle diameter d when the value of w is small. For example, the particle diameter d should be smaller than the line width w or, preferably, a half of the line width w. When the particle diameter d is too large, difficulties are encountered in forming a finely patterned lines with such a conductive paste containing coarse insulating particles. Usually, for example, the insulating particles should have a particle diameter in the range from 1 to 100 μm.

The amount of the insulating particles to be blended with the electroconductive paste is also important. Namely, it is preferable that the insulating particles are distributed uniformly throughout the area of the electroconductive patterned layer in a density of at least 20 particles or, more preferably, at least 50 particles per square millimeter on an assumption that no overlapping of particles is formed within the layer in the direction perpendicular to the plane of the layer. As a rough measure, the insulating particles are Compounded in an amount of 5 to 500 parts by volume or, preferably, 5 to 100 parts by volume per 100 parts by volume of the electroconductive paste.

The patterned electroconductive layer of the inventive heat-sealable connector sheet is formed from the above described composite conductive paste containing the insulating particles by a known method which is most conveniently a method of screen printing by using an appropriate screen having a mesh opening wide enough to pass the relatively coarse insulating particles. When the above described various parameters are adequately selected or controlled relative to the formulation of this composite conductive paste, protrusions are formed on the surface of the thus formed patterned layer by being raised by the underlying insulating particles thus to give a rugged surface of the patterned conductive layer which should preferably have a surface roughness of 2 to 80 μm. For example, even when the patterned conductive layer as formed by screen printing has a smooth surface without protrusions, the portions of the layer not supported by the insulating particles therein come to have a decreased thickness or to shrink along with evaporation of the solvent contained in the paste because the portions raised by the insulating particles cannot shrink so much even by evaporation of the solvent resulting in formation of protrusions there. It is important in this case that none of the insulating particles are exposed bare without being covered by the layer of the electroconductive paste. In other words, the surface of the patterned conductive layer is formed from the conductive paste throughout with no insulating particles exposed bare. In this connection, the thickness of the covering layer of the electroconductive paste on the surface of the insulating particles in the protruded portions should be in the range from 0.1 to 50 μm.

Though not essential, it is preferable that the patterned electroconductive layer formed in the above described manner on one surface of the insulating substrate is overcoated with a layer of a melt-flowable insulating adhesive resin, which overcoating layer may optionally extend to the surface of the insulating substrate not bearing the patterned electroconductive layer. FIG. 1 of the accompanying drawing illustrates such a connector sheet by a cross sectional view as cut perpendicularly to the plane of the sheet. In this figure, the substrate 1 is provided on one surface with lines 2 as a patterned electroconductive layer which consists of an electroconductive paste 2a forming the matrix phase and insulating particles 2b embedded in the paste 2a but forming protrusions on the surface of the patterned electroconductive layer 2. The patterned lines 2 of the electroconductive layer are overcoated with a layer 4 of a melt-flowable insulating adhesive, which, in this figure, is not limited to the surface of the patterned electroconductive layer 2 but extends to the surface of the substrate 1 not bearing the patterned electroconductive layer 2.

Various kinds of melt-flowable insulating adhesive resins can be used for forming the overcoating layer 4 on the surface of the patterned electroconductive layer 2 having protrusions raised by the insulating particles 2b. Namely, the principal ingredient of such an adhesive can be selected from the group consisting of copolymers of ethylene and vinyl acetate unmodified or modified with carboxyl groups, copolymers of ethylene and an alkyl acrylate, e.g., ethyl acrylate and isobutyl acrylate, polyamide resins, polyester resins, poly(methyl methacrylate) resins, poly(vinyl ether) resins, poly(vinyl butyral) resins, polyurethanes, copolymeric SBS rubbers unmodified or modified with carboxyl groups, S-I-S type copolymers of styrene and isoprene, SEBS-type copolymeric resins of styrene, ethylene and butyrene modified or unmodified with maleic acid, polybutadiene rubbers, polychloroprene rubbers unmodified or modified with carboxyl groups, styrene-butadiene copolymeric rubbers, isobutylene-isoprene copolymers, acrylonitrile-butadiene copolymeric rubbers unmodified or modified with carboxyl groups, epoxy resins, silicone rubbers and the like.

It is optional or rather preferable that the insulating adhesive for the overcoating layer 4 is admixed with a known tackifier according to need. Examples of suitable tackifiers include rosins, and derivatives thereof, terpene resins, copolymers of terpene and phenol, petroleum resins, coumarone-indene resins, styrene-based resins, isoprene-based resins, alkylphenol resins, phenolic resins and the like and they can be used either singly or as a combination of two kinds or more. Other optional additives in the insulating adhesive include reaction aids or crosslinking agents such as phenolic resins, polyols, isocyanates, melamine resins, urea resins, urotropine compounds, amines, acid anhydrides, organic peroxides, metal oxides, metal salts of an organic acid such as chromium trifluoroacetate, alkoxides of titanium, zirconium or aluminum, organometallic compounds such as dibutyltin oxide, photopolymerization initiators such as 2,2-diethoxy acetophenone and benzil, sensitizers such as amines, phosphorus compounds and chlorine compounds as well as curing agents, vulcanizing agents, modifiers, aging retarders, heat-resistance improvers, heat-conductivity improvers, softening agents, coloring agents, coupling agents, metal sequestering agents and so on.

The overcoating layer 4 of the melt-flowable insulating adhesive can be formed on the surface of the patterned electroconductive layer 2 by any of known methods including screen printing, gravure printing, roller coating, bar coating, knife coating, spray coating, spin coating and the like because the overcoating layer 4 can extend over the surface areas of the insulating substrate sheet 1 not bearing the patterned electroconductive layer 2 although the method of screen printing is preferred. The overcoating layer 4 of the melt-flowable insulating adhesive should have a thickness in the range from 1 to 50 $\mu$m. When the thickness thereof is too small, the desired effect which should be exhibited by the over-coating insulating adhesive layer cannot be obtained as a matter of course while, when the thickness is too large, failure in electric connection may be caused between the patterned electroconductive layer 2 and the electrode terminal, for example, on a circuit board after heat-sealing.

It is a convenient way that the thickness of the overcoating layer 4 of the insulating adhesive formed, for example, by screen printing is controlled by adjusting the viscosity or consistency by diluting the adhesive with an organic solvent. Suitable organic solvents naturally depend on the type of the adhesive resin but usually is selected from the group consisting of esters, ethers, ether esters, hydrocarbons, chlorinated hydrocarbons, alcohols and the like, of which esters, ketones and ether esters are preferred. Particular examples of the organic solvent include methyl acetate, ethyl acetate, isopropyl acetate, isobutyl acetate, n-butyl acetate, amyl acetate, methyl ethyl ketone, methyl isoamyl ketone, methyl n-amyl ketone, ethyl n-amyl ketone, di(isobutyl) ketone, methoxymethyl pentanone, cyclohexanone, diacetone alcohol, ethyleneglycol monomethyl ether acetate, ethyleneglycol monoethyl ether acetate, ethyleneglycol monobutyl ether acetate, methoxybutyl acetate, diethyleneglycol monomethyl ether acetate, diethyleneglycol monoethyl ether acetate, diethyleneglycol monoethyl ether acetate, diethyleneglycol monobutyl ether acetate, trichloroethane, trichloroethylene, di(n-butyl) ether, diisoamyl ether, n-butyl phenyl ether, propylene oxide, furfural, isopropyl alcohol, isobutyl alcohol, amyl alcohol, cyclohexanol, benzene, toluene, xylene, isopropyl benzene, petroleum spirit, petroleum naphtha and the like.

Figure 2:
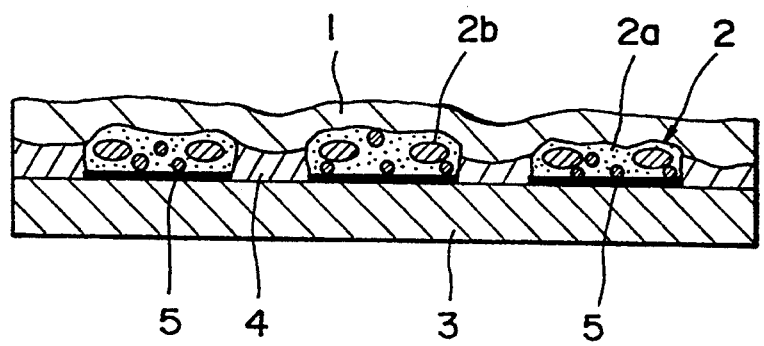
FIG. 2 illustrates a cross section of the heat-sealable connector sheet of FIG. 1 after heat-sealing to a circuit board having electrode terminals.

FIG. 2 of the accompanying drawing illustrates a circuit board 3 bearing electrode terminals 5 after heat-sealing with the inventive heat-sealable connector sheet by a cross section. When the inventive heat-sealable connector sheet is pressed with heating against the circuit board 3 in such a disposition that each of the electrode terminals 5 on the circuit board 3 is in contact with one of the lines of the patterned electroconductive layer 2, the melt-flowable insulating resin 4 covering the surface of each of the conductive lines 2 is driven out from the space between the electrode terminal 5 and the conductive line 2 so as to establish electric connection therebetween provided that the thickness of the insulating adhesive overcoating layer 4 is not overly large while the insulating adhesive excluded from the space by melt-flowing is pooled between two conductive lines 2 to establish adhesive bonding of the circuit board 3 and the connector sheet and to ensure electric insulation between the two conductive lines 2 or hence between the two electrode terminals 5 even when flowing deformation of the conductive lines 2 takes place.

The above described heat-sealable connector sheet of the invention is advantageous in respect of the high reliability of electric connection established therewith and the electric insulation between adjacent terminal electrodes 5. A problem in this connector sheet is that, when the width of each of the electrode terminals 5 and the arrangement pitch thereof are decreased finer and finer, formation of the patterned electroconductive layer 2 by screen printing is sometimes incomplete because the electroconductive paste 2a used for printing is compounded with relatively coarse insulating particles 2b. The inventors have arrived at a discovery that this problem can be solved when the patterned electroconductive layer 2 has a double-layered structure of which the underlying layer in contact with the substrate sheet 1 is formed from an electroconductive paste 2a containing no insulating particles and the surface layer, which comes into contact with the electrode terminals 5 on the circuit board 3 when the connector sheet is on use, is made from an electroconductive paste 2a compounded with electrically insulating relatively coarse particles 2b. A heat-sealable connector sheet of this type is illustrated in FIG. 3 by a cross section as cut perpendicularly to the plane of the sheet.

Figure 3:
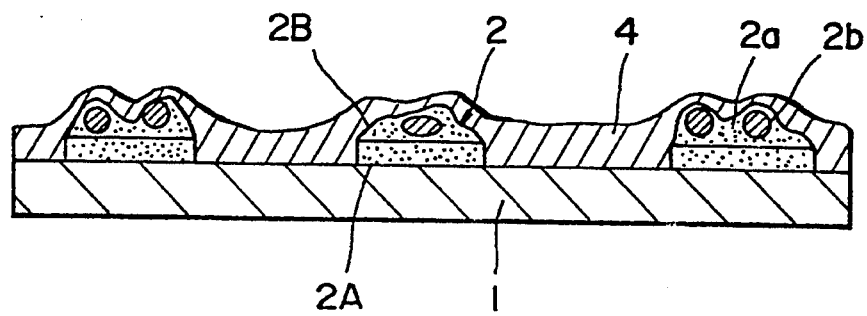
FIG. 3 is a cross sectional view of an embodiment of the inventive heat-sealable connector sheet as cut perpendicularly to the plane of the sheet in which the patterned electroconductive layer has a double-layered structure.

As is understood from FIG. 3, the connector sheet of this type is prepared by forming a patterned electroconductive layer 2 on an electrically insulating substrate sheet 1 having flexibility and then providing an overcoating insulating melt-flowable adhesive layer 4 while the patterned electroconductive layer 2 has a double-layered structure consisting of an underlying layer 2A formed from an electroconductive paste and adhesively bonded to the substrate sheet 1 and a surface layer 2B which is formed from an electroconductive paste 2a compounded with insulating particles 2b. The patterned electroconductive layer 2 consisting of two layers 2A and 2B can be formed by the method of screen printing in which the underlying patterned layer 2A is first formed by printing with a conventional electroconductive paste or ink and then the surface layer 2B is formed in the same pattern with an electroconductive paste 2a blended with insulating particles 2b. The thickness of the underlying conductive layer 2A is preferably in the range from 0.5 to 25 $\mu$m and the thickness of the surface layer 2B is preferably in the range from 0.5 to 25 $\mu$m while the protrusions on the surface of the patterned electroconductive layer should have a height of 2 to 80 $\mu$m. The other requirements for the surface layer 2B are about the same as those for the single-layered patterned electroconductive layer 2 illustrated in FIG. 1.

In the following, the heat-sealable connector sheet of the invention is illustrated in more detail by way of examples.

Example 1

An electroconductive paste for screen printing compounded with insulating particles was prepared in the following manner. Thus, an electroconductive paste was first prepared by uniformly blending 100 parts by of an epoxy resin of the bisphenol A type as an organic binder with 70 parts by weight of a silver powder consisting of flaky particles having a particle diameter of 1 to 3 $\mu$m, 3 parts by weight of an amine-based curing accelerator for the epoxy resin and each 1 part by weight of a levelling agent, dispersion stabilizer, antifoam agent and thixotropy-imparting agent with dilution by adding a suitable volume of a 7:3 by volume mixture of toluene and methyl ethyl ketone. Thereafter, 30 parts by volume of a fine powder of a cured phenolic resin having an aver-age particle diameter of about 20 $\mu m$ and a compressive strength of 3.9 kgf/mm$^2$ at 10% deformation were added to the above prepared electroconductive paste per 100 parts by volume of the solid matter therein. The thus prepared composite electroconductive paste after drying and curing exhibited a compressive strength of 5.0 kgf/mm$^2$ at 10% deformation.

Screen printing was conducted with the above prepared composite electroconductive paste on a 25 $\mu m$ thick flexible substrate sheet of a poly(ethylene naphthalate) resin to form a patterned electroconductive layer having a thickness of 25 $\mu m$ after drying in a line-wise pattern with a pitch of 0.3 mm and width of each line of 0.15 mm.

Separately, an insulating melt-flowable adhesive composition was prepared by uniformly blending 100 parts by weight of a carboxyl-modified NBR with 40 parts by weight of an alkylphenol-based tackifier and each 1 part by weight of a phenolic resin as an aging retarder, titanium dioxide as a heat-resistance improver and aminosilane-based coupling agent followed by dilution with a 1:1 by volume mixture of petroleum naphtha and butyl Carbitol to give a solid content of 35% by weight.

The substrate sheet provided with a patterned electroconductive layer thereon was overcoated with the above prepared insulating melt-flowable adhesive by using a bar coater in a thickness of 10 $\mu m$ after drying. Heat-sealable connector sheets of the invention were obtained by cutting the above obtained sheet in predetermined dimensions.

The heat-sealable connector sheets prepared in the above described manner were each heat-sealed to a circuit board having electrode terminals of a transparent electroconductive ITO film, of which the surface resistivity was 30 ohm, by pressing at 140° C. for 12 seconds under a pressure of 30 kgf/cm$^2$. The thus prepared assembly of the circuit board and the connector sheet was subjected to the measurement of the electric resistance between an electrode terminal on the former and a line of the patterned electroconductive layer on the latter after an aging test carried out in two different ways. Thus, on one hand, the assembly was subjected to 1000 times repeated heating and cooling cycle each cycle consisting of a high-temperature stage at 85° C. for 30 minutes and a low temperature stage at −30° C. for 30 minutes. The measurement of the electric resistance was undertaken either immediately after the heating and cooling cycles for heat shock or after standing in an atmosphere of a relative humidity of 95% at 60° C. for 240, 500 and 1000 hours to give the values of the electric resistance in ohm shown in Table 1A below including the average value, maximum value and minimum value for each of the measuring conditions. On the other hand, the aging test was performed without the heat shock test by keeping the assembly in a high-temperature and high-humidity atmosphere of 95% relative humidity at 60° C. and the measurement of the electric resistance was undertaken either as prepared or after standing for 240, 500 and 1000 hours in the above mentioned atmosphere. The results are shown in Table 1B below.

Comparative Example 1

The same experimental procedure as in Example 1 was repeated excepting replacement of the particles of the cured phenolic resin compounded in the electroconductive paste with the same volume of silver-plated spherical particles of nickel having an average particle diameter of about 20 $\mu m$ with a coefficient of variation of the diameter of 8%, of which the compressive strength was 16.3 kgf/mm$^2$ at 10% deformation. Tables 1A and 1B also show the results of the measurement of the electric resistance in ohm carried out in the same manner as in Example 1 after each of the aging tests carried out after the heating and cooling cycles and the high-temperature, high-humidity test, respectively.

TABLE 1A

|  | Example 1 | | | Comparative Example 1 | | |
|---|---|---|---|---|---|---|
|  | Av. | Max. | Min. | Av. | Max. | Mn. |
| Initial | 242 | 265 | 221 | 315 | 484 | 285 |
| After 240 hours | 258 | 284 | 277 | 842 | 1256 | 517 |
| After 500 hours | 277 | 301 | 248 | 6.3k | 18k | 3.1k |
| After 1000 hours | 289 | 325 | 255 | — | ∞* | 5.5k |

*line broken due to electric corrosion

TABLE 1B

|  | Example 1 | | | Comparative Example 1 | | |
|---|---|---|---|---|---|---|
|  | Av. | Max. | Min. | Av. | Max. | Mn. |
| Initial | 249 | 272 | 224 | 385 | 427 | 346 |
| After 240 hours | 261 | 295 | 238 | 11k | 36k | 6.8k |
| After 500 hours | 279 | 302 | 250 | — | ∞* | 45k |
| After 1000 hours | 291 | 315 | 265 | — | — | — |

*line broken due to electric corrosion

Example 2

An electroconductive paste was prepared by uniformly blending 100 parts by weight of a curable resin mixture consisting of a saturated copolymeric polyester resin having an average molecular weight of 20,000 to 25,000, hydroxy value of 6.0 mg KOH/g, acid value of 1.0 mg KOH/g and solubility parameter of 9.2 and a blocked isocyanate which was a biuret trimer of hexamethylene diisocyanate blocked with methyl ethyl ketoxime with 870 parts by weight of flaky silver particles having a particle diameter of 1 to 3 $\mu m$ and each 5 parts by weight of a polymeric levelling agent and a finely divided silica powder as a thixotropy-imparting agent by dilution with 200 parts by weight of ethyl Carbitol to give an electroconductive paste.

The above prepared electroconductive paste was admixed, per 100 parts by volume of the solid matter in the electroconductive paste, with 45 parts by volume of a nylon powder consisting of spongy porous particles of 30% porosity having a compressive strength of 3.0 kgf/mm$^2$ at 10% deformation, of which the average particle diameter was about 30 $\mu m$ with a coefficient of variation of the particle diameter of 7%, as the insulating particles.

Heat-sealable connector sheets were prepared in the same manner as in Example 1 by the method of screen printing with the above prepared electroconductive paste compounded with the porous nylon particles and subjected to the same evaluation tests as in Example 1 for the electric resistance between the electrode terminal of the circuit board and the patterned electroconductive layer of the connector sheet. Tables 2A and 2B below show the results obtained in these tests giving the values of the resistance in ohm obtained by the measurements after standing in a high-temperature, high-humidity atmosphere either following or before the heat-shock test, respectively.

Examples 3 to 5.

The experimental procedure in each of these Examples was just the same as in Example 2 described above excepting replacement of the porous nylon particles with the same volume of another porous nylon particles of one of other grades listed below.

Example 3: average particle diameter about 15 μm; variation coefficient of particle diameter 4%; porosity 30%

Example 4: average particle diameter about 80 μm; variation coefficient of particle diameter 8%; porosity 30%

Example 5: average particle diameter about 30 μm; variation coefficient of particle diameter 120%; porosity 30%

The results of the evaluation tests are also shown in Tables 2A and 2B.

TABLE 2A

|  | Av. | Max. | Min. | Av. | Max. | Min. |
|---|---|---|---|---|---|---|
|  | Example 2 | | | Example 3 | | |
| Initial | 187 | 228 | 165 | 312 | 423 | 256 |
| After 240 hours | 199 | 239 | 168 | 366 | 506 | 299 |
| After 500 hours | 205 | 245 | 172 | 398 | 611 | 312 |
| After 1000 hours | 208 | 250 | 174 | 413 | 635 | 316 |
|  | Example 4 | | | Example 5 | | |
| Initial | 220 | 383 | 155 | 335 | 532 | 166 |
| After 240 hours | 249 | 419 | 168 | 402 | 712 | 215 |
| After 500 hours | 269 | 435 | 198 | 458 | 763 | 229 |
| After 1000 hours | 298 | 485 | 213 | 559 | 783 | 246 |

TABLE 2B

|  | Av. | Max. | Min. | Av. | Max. | Min. |
|---|---|---|---|---|---|---|
|  | Example 2 | | | Example 3 | | |
| Initial | 194 | 235 | 173 | 293 | 398 | 232 |
| After 240 hours | 206 | 259 | 188 | 342 | 522 | 301 |
| After 500 hours | 212 | 268 | 201 | 426 | 729 | 326 |
| After 1000 hours | 222 | 284 | 213 | 455 | 755 | 339 |
|  | Example 4 | | | Example 5 | | |
| Initial | 235 | 371 | 153 | 355 | 592 | 141 |
| After 240 hours | 258 | 470 | 166 | 458 | 819 | 198 |
| After 500 hours | 271 | 489 | 196 | 649 | 993 | 247 |
| After 1000 hours | 358 | 689 | 229 | 764 | 1100 | 356 |

Example 6 and Comparative Example 2

A 25 μm thick PET film as a substrate sheet was provided with a line-wise patterned electroconductive layer of a double-layered structure having a line width of 0.15 mm and a pitch of 0.3 mm by first printing with the electroconductive paste prepared in Example 1 before compounding with the insulating phenolic resin particles and then with the same electroconductive paste after compounding with the insulating phenolic resin particles followed by overcoating with the same insulating melt-flowable adhesive as in Example 1 to complete a heat-sealable connector sheet. The thickness of the layers formed by the first and second printings was 10 μm and 20 μm, respectively, each after drying and curing.

For comparison, in Comparative Example 2, another heat-sealable connector sheet was prepared in just the same manner as above excepting replacement of the electroconductive paste for the surface layer compounded with the insulating phenolic resin particles with the same electroconductive paste as prepared in Comparative Example 1 by compounding with silver-plated nickel particles.

These heat-sealable connector sheets were subjected to the evaluation tests in the same manner as in Example 1 to give the results shown in Tables 3A and 3B giving the values of the electric resistance in ohm obtained by the measurements after standing in the high-temperature, high-humidity atmosphere the either following or before the heat-shock test, respectively.

TABLE 3A

|  | Example 6 | | | Comparative Example 2 | | |
|---|---|---|---|---|---|---|
|  | Av. | Max. | Min. | Av. | Max. | Mn. |
| Initial | 249 | 272 | 227 | 318 | 484 | 283 |
| After 240 hours | 252 | 287 | 239 | 532 | 840 | 251 |
| After 500 hours | 280 | 295 | 247 | 6.2k | 17k | 3.1k |
| After 1000 hours | 295 | 322 | 262 | — | ∞* | 5.4k |

*line broken due to electric corrosion

TABLE 3B

|  | Example 6 | | | Comparative Example 2 | | |
|---|---|---|---|---|---|---|
|  | Av. | Max. | Min. | Av. | Max. | Mn. |
| Initial | 248 | 272 | 223 | 386 | 429 | 345 |
| After 240 hours | 260 | 295 | 239 | 11k | 36k | 6.8k |
| After 500 hours | 280 | 303 | 251 | — | ∞* | 46k |
| After 1000 hours | 291 | 315 | 265 | — | — | — |

*line broken due to electric corrosion

What is claimed is:

1. A heat-sealable connector sheet which comprises, as an integral body:
   (a) a substrate sheet made from an electrically insulating material having flexibility;
   (b) a patterned electroconductive layer formed on one surface of the substrate sheet from an electroconductive paste compounded with electrically insulating particles having elasticity in such a fashion that the electrically insulating particles are fully embedded in the electroconductive paste but to form protrusions on the surface of the layer of the electroconductive paste raised by the insulating particles; and
   (c) an overcoating layer of an electrically insulating melt-flowable adhesive on the surface of the patterned electroconductive layer.

2. The heat-sealable connector sheet as claimed in claim 1 in which the overcoating layer of an electrically insulating melt-flowable adhesive extends to the surface of the substrate sheet not covered by the patterned electroconductive layer.

3. The heat-sealable connector sheet as claimed in claim 1 in which the substrate sheet has a thickness in the range from 10 to 50 μm.

4. The heat-sealable connector sheet as claimed in claim 1 in which the electroconductive paste is a composite material consisting of an organic insulating binder resin as the matrix and fine particles having electric conductivity dispersed in the matrix of the insulating binder resin.

5. The heat-sealable connector sheet as claimed in claim 4 in which the fine particles having electric conductivity have an average particle diameter in the range from 0.1 to 10 μm.

6. The heat-sealable connector sheet as claimed in claim 1 in which the electrically insulating particles are made from a polymeric material.

7. The heat-sealable connector sheet as claimed in claim 1 in which the patterned electroconductive layer has a thickness in the range from 5 to 30 μm.

8. The heat-sealable connector sheet as claimed in claim 1 in which the electrically insulating particles have a particle diameter of at least one third of the thickness of the patterned electroconductive layer.

9. The heat-sealable connector sheet as claimed in claim 1 in which the distribution density of the electrically insulating particles in the patterned electroconductive layer is at least 20 particles per square millimeter.

10. The heat-sealable connector sheet as claimed in claim 1 in which the overcoating layer of an electrically insulating melt-flowable adhesive has a thickness in the range from 1 to 50 μm.

11. The heat-sealable connector sheet as claimed in claim 1 in which the electrically insulating particles have a porous structure with a porosity in the range from 5 to 80%.

12. The heat-sealable connector sheet as claimed in claim 1 in which the patterned electroconductive layer has a double-layered structure consisting of an underlying layer of an electroconductive paste containing no insulating particles and a surface layer of an electroconductive paste compounded with electrically insulating particles.

13. The heat-sealable connector sheet as claimed in claim 12 in which the underlying layer of the double-layered patterned electroconductive layer has a thickness in the range from 0.5 to 25 μm.

14. The heat-sealable connector sheet as claimed in claim 12 in which the surface layer of the double-layered patterned electroconductive layer has a thickness in the range from 0.5 to 25 μm.

* * * * *